US009755614B2

(12) United States Patent
Kadota

(10) Patent No.: US 9,755,614 B2
(45) Date of Patent: Sep. 5, 2017

(54) TUNABLE FILTER

(71) Applicant: Murata Manufacturing Co., Ltd., Nagaokakyo-shi, Kyoto-fu (JP)

(72) Inventor: Michio Kadota, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 4 days.

(21) Appl. No.: 14/934,390

(22) Filed: Nov. 6, 2015

(65) Prior Publication Data
US 2016/0065165 A1 Mar. 3, 2016

Related U.S. Application Data

(63) Continuation of application No. PCT/JP2014/063992, filed on May 27, 2014.

(30) Foreign Application Priority Data

May 28, 2013 (JP) .................................. 2013-111918

(51) Int. Cl.
*H03H 9/54* (2006.01)
*H03H 9/64* (2006.01)
(Continued)

(52) U.S. Cl.
CPC ........ *H03H 9/6403* (2013.01); *H03H 7/0138* (2013.01); *H03H 7/0153* (2013.01);
(Continued)

(58) Field of Classification Search
CPC .... H03H 7/0138; H03H 7/0153; H03H 7/075; H03H 7/012; H03H 9/25; H03H 9/6403;
(Continued)

(56) References Cited

U.S. PATENT DOCUMENTS 5,291,159 A * 3/1994 Vale .................. H03H 7/12
333/174
5,559,481 A 9/1996 Satoh et al.
(Continued)

FOREIGN PATENT DOCUMENTS

JP 62-085505 A * 4/1987
JP 02-127810 A * 5/1990
(Continued)

OTHER PUBLICATIONS

Official Communication issued in International Patent Application No. PCT/JP2014/063992, dated Aug. 19, 2014.

*Primary Examiner* — Barbara Summons
(74) *Attorney, Agent, or Firm* — Keating & Bennett, LLP

(57) ABSTRACT

A tunable filter is a ladder circuit tunable filter including serial arm resonators and a parallel arm resonator. The serial arm resonators and the parallel arm resonator include elastic wave resonators. Variable capacitors are connected in series to the serial arm resonators, a variable capacitor is connected in parallel to the parallel arm resonator, and first inductors are connected in series to the serial arm resonators. When an impedance at a resonant frequency of the serial arm resonators is Zrs and an impedance at a resonant frequency of the parallel arm resonator is Zrp, a ratio Zrs/Zrp is not greater than 1.

19 Claims, 7 Drawing Sheets

(51) Int. Cl.
*H03H 7/075* (2006.01)
*H03H 7/01* (2006.01)
*H03H 9/25* (2006.01)
*H03H 9/02* (2006.01)

(52) U.S. Cl.
CPC .............. *H03H 9/25* (2013.01); *H03H 9/542* (2013.01); *H03H 9/6483* (2013.01); *H03H 2009/02165* (2013.01); *H03H 2210/015* (2013.01); *H03H 2210/02* (2013.01); *H03H 2210/025* (2013.01)

(58) Field of Classification Search
CPC ....... H03H 9/6483; H03H 2009/02165; H03H 2210/015; H03H 2210/02; H03H 9/542; H03H 2210/025; H03H 7/12
USPC .................... 333/17.1, 193–196, 186, 189
See application file for complete search history.

(56) References Cited

U.S. PATENT DOCUMENTS

| | | | | |
|---|---|---|---|---|
| 5,933,062 | A * | 8/1999 | Kommrusch | H03H 9/6483 310/313 B |
| 6,570,470 | B2 * | 5/2003 | Maehara | H03H 9/6483 310/313 B |
| 6,909,338 | B2 * | 6/2005 | Omote | H03H 9/542 333/133 |
| 7,030,718 | B1 * | 4/2006 | Scherer | H03J 3/20 331/117 R |
| 7,135,940 | B2 * | 11/2006 | Kawakubo | H03H 9/542 333/17.1 |
| 7,170,370 | B2 * | 1/2007 | Inoue | H03H 9/6426 333/189 |
| 7,274,274 | B2 * | 9/2007 | Carpentier | H03L 7/0805 333/187 |
| 8,242,861 | B2 * | 8/2012 | Yata | H03H 9/14594 333/193 |
| 2004/0227587 | A1 | 11/2004 | Inoue et al. | |
| 2007/0159274 | A1 | 7/2007 | Onzuka | |
| 2009/0251235 | A1 * | 10/2009 | Belot | H03H 9/605 333/187 |
| 2012/0286900 | A1 | 11/2012 | Kadota et al. | |
| 2012/0313726 | A1 | 12/2012 | Ueda et al. | |
| 2014/0266511 | A1 * | 9/2014 | Turner | G06F 17/505 333/193 |

FOREIGN PATENT DOCUMENTS

| | | |
|---|---|---|
| JP | 05-183380 A | 7/1993 |
| JP | 07-231241 A * | 8/1995 |
| JP | 10-65489 A | 3/1998 |
| JP | 2002-232264 A | 8/2002 |
| JP | 2004-343168 A | 12/2004 |
| JP | 2007-202136 A | 8/2007 |
| JP | 2009-130831 A | 6/2009 |
| JP | 2011-176746 A | 9/2011 |
| WO | 20111093449 A1 | 8/2011 |

* cited by examiner

TUNABLE FILTER

BACKGROUND OF THE INVENTION

1. Field of the Invention

The present invention relates to tunable filters including a plurality of elastic wave resonators, and particularly relates to a ladder circuit tunable filter.

2. Description of the Related Art

Many tunable filters capable of varying a pass band have been proposed thus far. For example, in the tunable filter disclosed in International Publication No. WO 2011/093449 A1, a serial arm resonator is disposed in a serial arm that connects an input end to an output end. An inductance for increasing the band width is connected in series to this serial arm resonator.

As another configuration, International Publication No. WO 2011/093449 A1 also discloses a ladder circuit tunable filter having a plurality of serial arm resonators and parallel arm resonators. According to this ladder circuit tunable filter, variable capacitors are connected in series and in parallel to the serial arm resonators.

Japanese Unexamined Patent Application Publication No. 2009-130831 also discloses a ladder circuit tunable filter. In Japanese Unexamined Patent Application Publication No. 2009-130831, respective variable capacitors are connected in series and in parallel to the serial arm resonators. Likewise, respective variable capacitors are connected in series and in parallel to the parallel arm resonators.

With the ladder circuit tunable filter disclosed in International Publication No. WO 2011/093449 A1, the ladder circuit tunable filter disclosed in Japanese Unexamined Patent Application Publication No. 2009-130831, and so on, connecting the variable capacitor not only enables the pass band to be varied, but also makes it possible to adjust a frequency-variable band width. However, the band of the resonator could not be sufficiently increased simply by connecting a variable capacitor.

Incidentally, with a ladder filter, an increase in out-of-band attenuation is achieved by increasing the ratio between serial arm resonator impedance and parallel arm resonator impedance. However, if the serial arm resonator impedance is too high, the filter will have increased insertion loss. Accordingly, the ratio between the serial arm resonator impedance and the parallel arm resonator impedance is normally set to three to six times.

Meanwhile, the tunable filter according to International Publication No. WO 2011/093449 A1 achieves an increase in band width by connecting an inductance to the serial arm resonator in series. However, there is a problem in that in the case where an attempt is made to widen the band of a serial arm or parallel arm resonator by connecting an inductance to the resonator, as in International Publication No. WO 2011/093449 A1, in a resonator where the ratio of serial arm resonator impedance and parallel arm resonator impedance is set to three to six times, the impedance ratio will increase even more. As a result, a resonant resistance of the serial resonator will increase, leading to a degradation in insertion loss and an inability to obtain sufficient characteristics.

SUMMARY OF THE INVENTION

Preferred embodiments of the present invention provide a low-loss tunable filter capable not only of increasing a variable band width but also of ensuring out-of-band attenuation.

A preferred embodiment of the present invention provides a ladder circuit tunable filter including a serial arm that connects an input end to an output end and a parallel arm that connects the serial arm to a ground potential. The tunable filter according to a preferred embodiment of the present invention includes a plurality of serial arm resonators, a parallel arm resonator, a first variable capacitor, a second variable capacitor, and a first inductance. The plurality of serial arm resonators are connected in series to each other in the serial arm. The parallel arm resonator is provided in the parallel arm.

The first variable capacitor is connected in series to the serial arm resonator. The second variable capacitor is connected in parallel to the parallel arm resonator. The first inductance is connected to each of the serial arm resonators. In a preferred embodiment of the present invention, when a resonant impedance at a resonant frequency of the serial arm resonator is represented by Zrs and a resonant impedance at the resonant frequency of the parallel arm resonator is represented by Zrp, a ratio Zrs/Zrp is not greater than 1. Preferably, Zrs<Zrp.

According to another aspect of a tunable filter according to a preferred embodiment of the present invention, the first inductance is connected in series to each serial arm resonator.

According to a specific aspect of a tunable filter according to a preferred embodiment of the present invention, when a resonant impedance of a series circuit portion including the serial arm resonator and the first inductance connected in series to the serial arm resonator is represented by $Zrs_0$, $Zrs_0$ is in a range from two to six times Zrp.

According to another specific aspect of a tunable filter according to a preferred embodiment of the present invention, a second inductance is connected in parallel to the parallel arm resonator.

According to yet another specific aspect of a tunable filter according to a preferred embodiment of the present invention, when a resonant impedance of a series circuit portion defined by the serial arm resonator and the first inductance connected in series to the serial arm resonator is represented by $Zrs_0$ and a resonant impedance of a parallel circuit portion defined by the parallel arm resonator and the second inductance connected in parallel to the parallel arm resonator is represented by $Zrp_0$, $Zrs_0$ is in a range from two to six times $Zrp_0$.

According to a different specific aspect of a tunable filter according to a preferred embodiment of the present invention, when an anti-resonant impedance of a series circuit portion defined by the serial arm resonator and the first inductance connected in series to the serial arm resonator is represented by $Zas_0$ and an anti-resonant impedance of a parallel circuit portion defined by the parallel arm resonator and the second inductance connected in parallel to the parallel arm resonator is represented by $Zap_0$, $Zas_0$ is greater than $Zap_0$.

According to yet another different specific aspect of a tunable filter according to a preferred embodiment of the present invention, an impedance ratio between an anti-resonant impedance and a resonant impedance of the serial arm resonator is not less than about 65 dB, for example.

According to yet another different specific aspect of a tunable filter according to a preferred embodiment of the present invention, an impedance ratio between an anti-resonant impedance and a resonant impedance of the parallel arm resonator is not less than about 65 dB, for example.

According to another specific aspect of a tunable filter according to a preferred embodiment of the present invention, the Q of the first inductance is not less than about 40, for example.

According to another specific aspect of a tunable filter according to a preferred embodiment of the present invention, the first inductance is connected in parallel to each serial arm resonator.

A tunable filter according to another specific aspect of a preferred embodiment of the present invention further includes a second inductance connected in parallel to the parallel arm resonator.

According to another specific aspect of a tunable filter according to a preferred embodiment of the present invention, when an impedance of a parallel circuit portion including the parallel arm resonator and the second inductance is represented by $Zrp_0$ and an impedance of a series circuit portion including the serial arm resonator and the first inductance is represented by $Zrs_0$, $Zrp_0$ is lower than $Zrs_0$.

A tunable filter according to another specific aspect of a preferred embodiment of the present invention further includes a second inductance connected in series to the parallel arm resonator.

According to another specific aspect of a tunable filter according to a preferred embodiment of the present invention, when an impedance of a parallel circuit portion including the parallel arm resonator and the second inductance is represented by $Zrp_0$ and an impedance of a series circuit portion including the serial arm resonator and the first inductance is represented by $Zrs_0$, $Zrp_0$ is lower than $Zrs_0$.

According to a tunable filter according to a preferred embodiment of the present invention, the ratio Zrs/Zrp is not greater than 1 and an inductance is connected to the serial arm resonator, and thus the filter band is widened, and out-of-band attenuation is ensured while maintaining low loss. Furthermore, because the first variable capacitor and second variable capacitor are respectively connected to the serial arm resonator and the parallel arm resonator, the variable band width is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Figure 1:
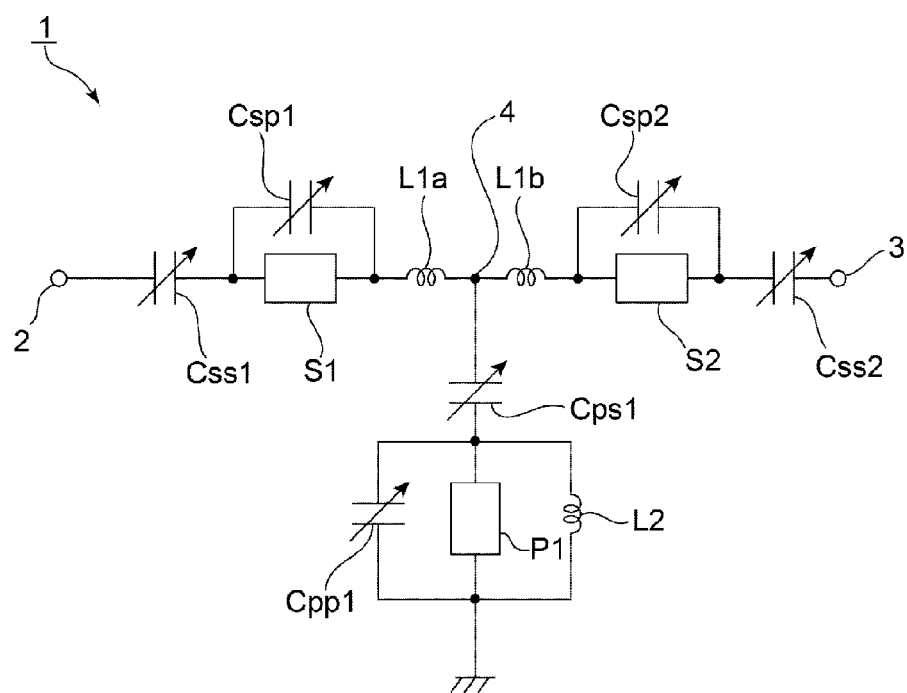
FIG. 1 is a circuit diagram illustrating a tunable filter according to a preferred embodiment of the present invention.

FIG. 1 is a circuit diagram illustrating a tunable filter according to a preferred embodiment of the present invention.

A tunable filter 1 includes an input terminal 2 and an output terminal 3. Serial arm resonators S1 and S2 are connected to each other in a serial arm that connects the input terminal 2 and the output terminal 3. A parallel arm resonator P1 is provided in a parallel arm that connects a connection point 4 between the serial arm resonators S1 and S2 to a ground potential. In other words, a T-shaped ladder circuit including the serial arm resonators S1 and S2 and the parallel arm resonator P1 is provided.

In the present preferred embodiment, the serial arm resonators S1 and S2 and the parallel arm resonator P1 preferably are defined by surface acoustic wave resonators. Of course, another elastic wave resonator such as a boundary acoustic wave resonator may be used. Furthermore, another resonator may be used instead of an elastic wave resonator.

A variable capacitor Css1 is connected in series to the serial arm resonator S1. A variable capacitor Csp1 is also connected in parallel to the serial arm resonator S1. A variable capacitor Css2 is connected in series to the serial arm resonator S2, and a variable capacitor Csp2 is connected in parallel to the serial arm resonator S2.

On the other hand, a variable capacitor Cpp1 is connected in parallel to the parallel arm resonator P1. A variable capacitor Cps1 is connected in series to the parallel arm resonator P1.

The pass band width is able to be adjusted by varying the electrostatic capacitances of the variable capacitors Css1, Csp1, Csp2, Css2, Cpp1, and Cps1. The basic configuration of such a tunable filter is also disclosed in International Publication No. WO 2011/093449 A1.

A feature of the tunable filter 1 is that when a resonant impedance of the serial arm resonators S1 and S2 is represented by Zrs and a resonant impedance of the parallel arm resonator P1 is represented by Zrp, or in other words, in the serial arm resonator and parallel arm resonator prior to connecting the variable capacitors and inductances, a ratio Zrs/Zrp is set to not greater than 1, and more preferably is set to less than 1. Here, "resonant impedance" refers to an impedance at the resonant frequency of a resonator, whereas the "resonant frequency" refers to a frequency at which the impedance of the resonator is minimum. Meanwhile, "anti-resonant impedance" refers to an impedance at the anti-resonant frequency of a resonator, whereas the "anti-resonant frequency" refers to a frequency at which the impedance of the resonator is maximum.

As described above, even if the ratio Zrs/Zrp is set to not greater than 1, a sufficient increase in band width is achieved by connecting the first inductances L1a and L1b to the serial arm resonators S1 and S2, respectively, in series. Furthermore, when the resonant impedance of the series circuit portion after the inductances are connected is represented by $Zrs_0$, the ratio between $Zrs_0$ and Zrp becomes two to six times, and thus an increase in the out-of-band attenuation is achieved. In addition, connecting the second inductance L2 to the parallel arm resonator P1 in parallel increases the band width even further. This will be described in further detail hereinafter.

Figure 2:
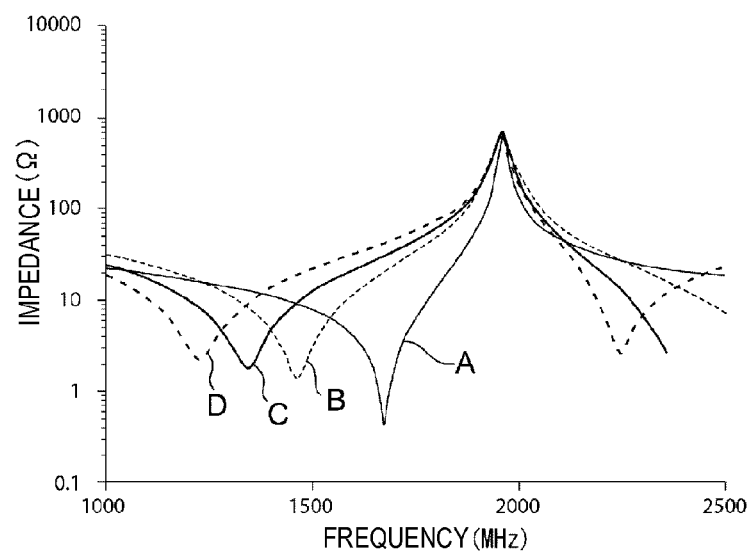
FIG. 2 is a graph illustrating impedance characteristics of a series circuit portion in the case where a first inductance having a variety of inductance values is connected in series to a serial arm resonator.

A solid line A in FIG. 2 represents the impedance characteristics of the serial arm resonator S1 when the first inductance L1a is not connected thereto. A broken line B, a solid line C, and a broken line D respectively indicate the impedance characteristics of the series circuit portion defined by connecting the first inductance to the serial arm resonator S1 in series, when the first inductance has a Q=40 and inductance values of 1 nH, 1.5 nH, and 2 nH, respectively, for example. Although the impedance of the resonator degrades by about 10 dB to about 15 dB due to the inductance being connected, this does not pose a significant problem in the case where an impedance ratio between the original anti-resonant frequency and resonant frequency of the resonator is not less than about 60 dB, for example. This resonator has an impedance ratio of about 65 dB, for example.

As is clear from FIG. 2, it can be seen that in the series circuit portion defined by connecting the first inductance L1a to the serial arm resonator S1 in series, the resonant resistance is greater than in the resonance characteristics of the original serial arm resonator S1. In other words, it can be seen that the impedance at the resonant frequency increases and the resonant frequency decreases as the inductance value of the connected first inductance L1a increases.

Figure 3:
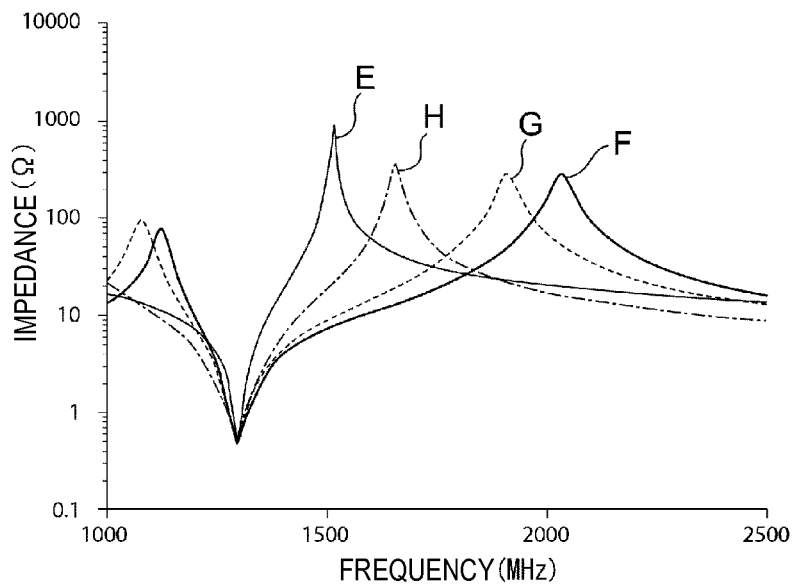
FIG. 3 is a graph illustrating impedance characteristics of a parallel circuit portion in the case where a second inductance having a variety of inductance values is connected in parallel to a parallel arm resonator.

On the other hand, a solid line E in FIG. 3 indicates the impedance characteristics of the parallel arm resonator P1. A solid line F, a broken line G, and a dot-dash line H in FIG. 3 respectively indicate the impedance characteristics of the parallel circuit portion defined by connecting the second inductance L2 to the parallel arm resonator P1 in parallel, when the second inductance L2 has a Q=40 and inductance values of 1.5 nH, 1.85 nH, and 2 nH, respectively, for example. Although a degradation in the impedance ratio can also be seen here, this does not pose a problem as long as the impedance ratio between the original anti-resonant frequency and resonant frequency of the resonator is not less than about 60 dB, for example.

As is clear from FIG. 3, it can be seen that that the impedance value at the resonant frequency does not change and the anti-resonant frequency increases in the case where the second inductance L2 is connected in parallel to the parallel arm resonator P1. In addition, the impedance value at the anti-resonant frequency decreases.

Of course, it can be seen that the anti-resonant frequency increases more the lower the inductance value of the second inductance L2 is.

Figure 4:
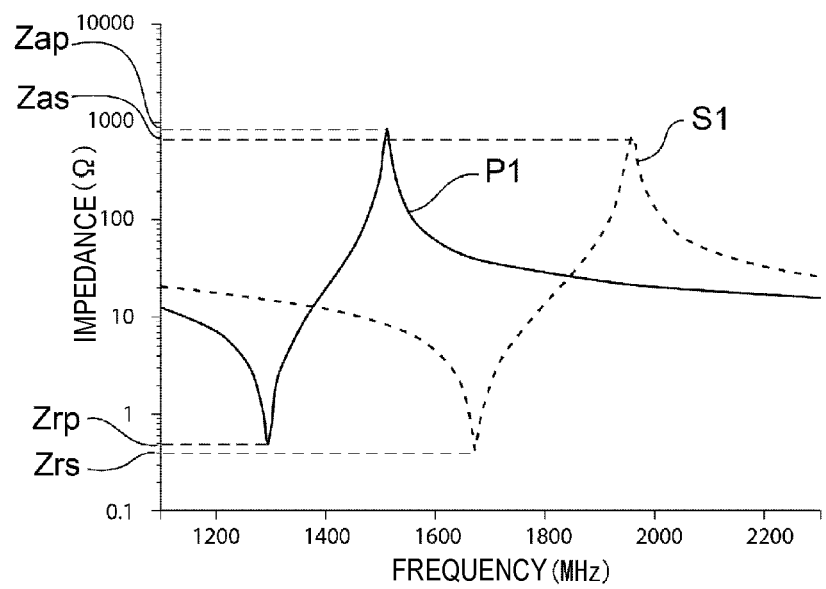
FIG. 4 is a graph illustrating impedance characteristics of a serial arm resonator and a parallel arm resonator included in a tunable filter according to a preferred embodiment of the present invention.

FIG. 4 is a graph illustrating the impedance characteristics of the serial arm resonator S1 and the parallel arm resonator P1 preferably included in the present preferred embodiment. A broken line S1 in FIG. 4 represents the impedance characteristics of the serial arm resonator S1, whereas a solid line P1 represents the impedance characteristics of the parallel arm resonator P1. Here, Zrp=0.47Ω, and Zrs=0.40Ω, for example.

As is clear from FIG. 4, the resonant impedance Zrs at the resonant frequency of the serial arm resonator S1 is lower than the resonant impedance Zrp at the resonant frequency of the parallel arm resonator P1. Accordingly, out-of-band attenuation is ensured while maintaining low loss.

Figure 5:
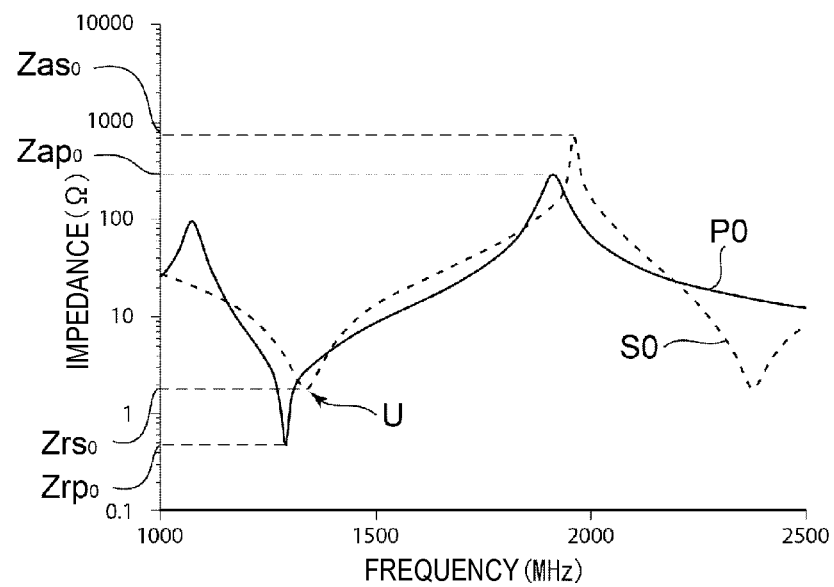
FIG. 5 is a graph illustrating impedance characteristics of a series circuit portion in which a first inductance is connected in series to a serial arm resonator having the characteristics illustrated in FIG. 4 and impedance characteristics of a parallel circuit portion in which a second inductance is connected in parallel to a parallel arm resonator having the characteristics illustrated in FIG. 4.

On the other hand, FIG. 5 illustrates the impedance characteristics of a series circuit portion S0 defined by connecting the first inductance L1a having an inductance value of about 1.5 nH, for example, to the serial arm resonator S1 and the impedance characteristics of a parallel circuit portion P0 in which the second inductance L2 having an inductance value of about 1.85 nH, for example, is connected in parallel to the parallel arm resonator P1. In the series circuit portion, the impedance is increased near the resonant frequency, as indicated by an arrow U in FIG. 5. On the other hand, the anti-resonant impedance is also higher in the series circuit portion, and when the anti-resonant impedance of the series circuit portion is represented by $Zas_0$ and the anti-resonant impedance of the parallel circuit portion is represented by $Zap_0$, $Zas_0 > Zap_0$.

Accordingly, the impedance at the resonant frequency of the series circuit portion is greater than the impedance at the resonant frequency of the parallel circuit portion. In other words, $Zrs_0 > Zrp_0$. Accordingly, in the present preferred embodiment, the serial arm resonator S1 and the parallel arm resonator P1 whose ratio Zrs/Zrp is lower than 1 before the variable capacitors, inductances, and so on are connected are used. However, the relationship of the resonant impedances after the variable capacitors, inductances, and so on are connected is $Zrs_0 > Zrp_0$, and thus the out-of-band attenuation is sufficiently increased. In addition, when $Zas_0 > Zap_0$, the out-of-band attenuation is increased even further. The pass band position and band width are then able to be varied by adjusting the capacitance of the variable capacitors in accordance with the circuit configuration.

Although the second inductance L2 is preferably included in the present preferred embodiment, it should be noted that the second inductance L2 may be omitted. However, it is preferable that the second inductance L2 be provided, and further desirable that $Zas_0 > Zap_0$. This makes it possible to further increase the band width.

Figure 6:
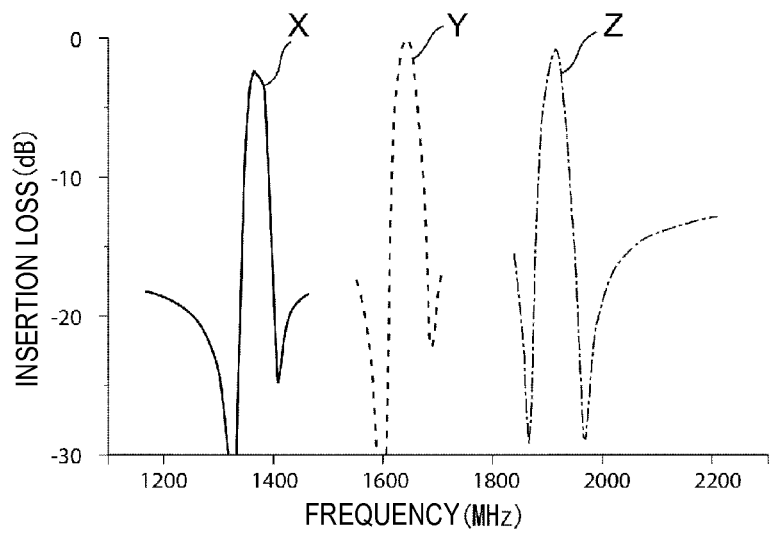
FIG. 6 is a graph illustrating filter characteristics of a tunable filter according to a preferred embodiment of the present invention.

FIG. 6 is a graph illustrating filter characteristics of the tunable filter 1 according to the present preferred embodiment in the case where the variable capacitors Css1, Csp1, Csp2, Css2, Cpp1, and Cps1 are combined as indicated by X, Y, or Z in the following Table 1.

TABLE 1

| (Unit: pF) | Css1 | Csp1 | Csp2 | Css2 | Cpp1 | Cps1 |
|---|---|---|---|---|---|---|
| X | (none) | 50 | 50 | (none) | 40 | (none) |
| Y | 1 | 2.7 | 2.7 | 1 | 5 | 2 |
| Z | 0.3 | (none) | (none) | 0.3 | (none) | 1.5 |

Note that L1$a$=L1$b$=1.5 nH and L2=1.85 nH, for example.

As is clear from FIG. 6, it can be seen that a large frequency variation range of about 34% is able to be achieved by adjusting the electrostatic capacities of the variable capacitors.

Figure 8:
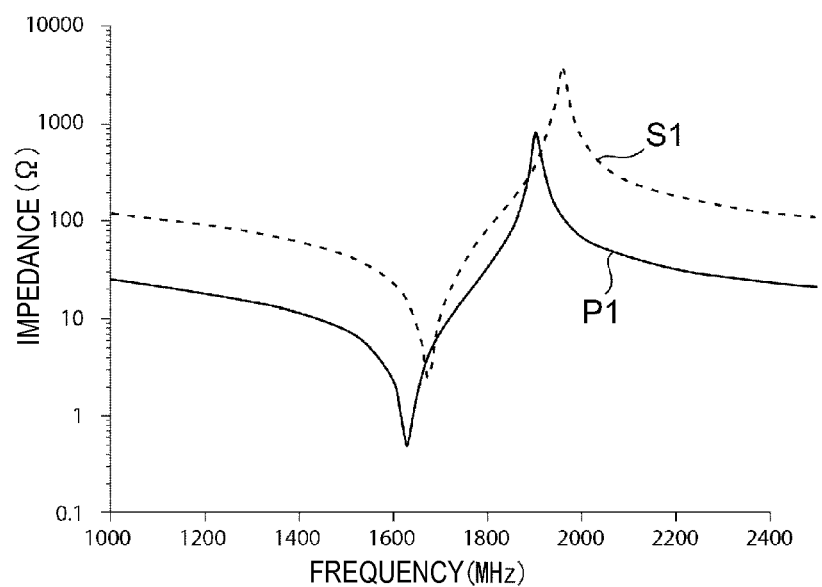
FIG. 8 is a graph illustrating impedance characteristics of a serial arm resonator and a parallel arm resonator used in a ladder circuit tunable filter according to a comparative example.
Figure 9:
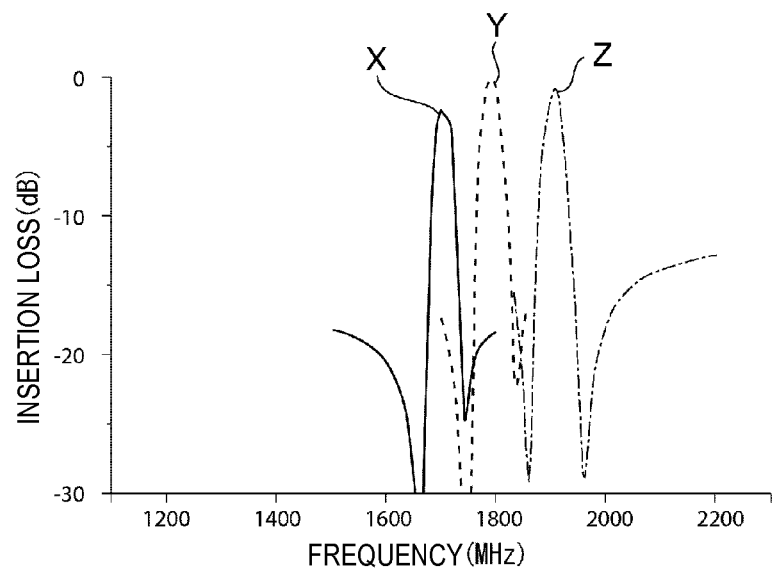
FIG. 9 is a graph illustrating filter characteristics of a tunable filter according to a comparative example.

In comparison, FIG. 9 illustrates filter characteristics of a tunable filter according to a comparative example. In the tunable filter according to this comparative example, the impedance characteristics of the serial arm resonator S1 and the parallel arm resonator P1 are as illustrated in FIG. 8. Here, the resonant impedance Zrs at the resonant frequency of the serial arm resonator S1 is four times the resonant impedance Zrp at the resonant frequency of the parallel arm resonator P1. In addition, the band width, which corresponds to a resonant frequency-anti-resonant frequency difference of the serial arm resonator S1 and the parallel arm resonator P1, is approximately 17%, for example.

The serial arm resonator S1 and the parallel arm resonator P1 were used to configure the same tunable filter as in the present preferred embodiment, with the exception of the first and second inductances L1$a$, L1$b$, and L2 not being connected. Then, the electrostatic capacities of the variable capacitors Css1, Csp1, Csp2, Css2, Cpp1, and Cps1 were set as indicated in Table 2.

TABLE 2

| (Unit: pF) | Css1 | Csp1 | Csp2 | Css2 | Cpp1 | Cps1 |
|---|---|---|---|---|---|---|
| X | 7 | 3 | 3 | 7 | 15 | 15 |
| Y | 0.6 | 0.7 | 0.7 | 0.6 | 3 | 3 |
| Z | (none) | 0.2 | 0.2 | (none) | (none) | 1 |

As is clear from FIG. 9, the frequency variation range of the tunable filter according to the comparative example is narrow at approximately 9%, for example.

In addition, as is clear from comparing FIGS. 6 and 9, it can be seen that the out-of-band attenuation in the tunable filter according to the preferred embodiment illustrated in FIG. 6 is almost equal to the out-of-band attenuation in the tunable filter according to the comparative example. Accordingly, it can be seen that a sufficient out-of-band attenuation is able to be achieved while maintaining low loss even in the case of the present preferred embodiment, where rather than Zrs>Zrp, the ratio Zrs/Zrp is lower than 1.

Thus, according to a tunable filter of a preferred embodiment of the present invention, out-of-band attenuation is able to be ensured and the frequency variation range is able to be increased while maintaining low loss.

Figure 7:
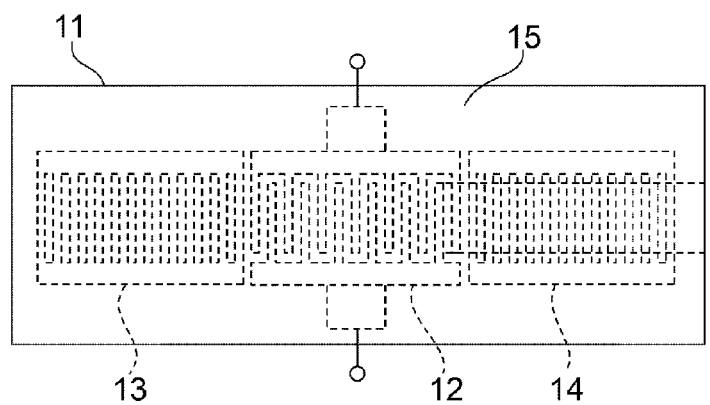
FIG. 7 is a plan view illustrating an elastic wave resonator used in a tunable filter according to a preferred embodiment of the present invention.

Note that the elastic wave resonators that define the serial arm resonators S1 and S2 and parallel arm resonator P1 are not particularly limited, and these resonators can include the surface acoustic wave resonator illustrated in FIG. 7, for example. In this surface acoustic wave resonator, an interdigital transducer electrode 12 is provided on a piezoelectric substrate 11. Reflectors 13 and 14 are provided on both sides of the interdigital transducer electrode 12 in a surface acoustic wave propagation direction. A dielectric layer is preferably made of SiO2 or the like so as to cover the interdigital transducer electrode 12 and the reflectors 13 and 14. Note that the dielectric layer 15 need not be provided.

The serial arm resonator S1, the parallel arm resonator P1, and so on can be defined by a general single-port surface acoustic wave resonator, for example. Of course, another elastic wave resonator such as a boundary acoustic wave resonator may be used.

In addition, although two serial arm resonators S1 and S2 and one parallel arm resonator P1 are preferably included in the preferred embodiment of FIG. 1, the number of serial arm resonators and parallel arm resonators in the ladder circuit configuration is not limited to the configuration described in the preferred embodiment. Although a T-shaped ladder filter circuit configuration is indicated here, the effects of various preferred embodiments of the present invention can be achieved under the same conditions even with a π-shaped ladder filter. The preferred embodiment can be varied as appropriate as long as these ladder filter configurations are present.

Meanwhile, the variable capacitors Csp1 and Csp2, the variable capacitor Cps1, and so on may be omitted when configuring the tunable filter.

Figure 10:
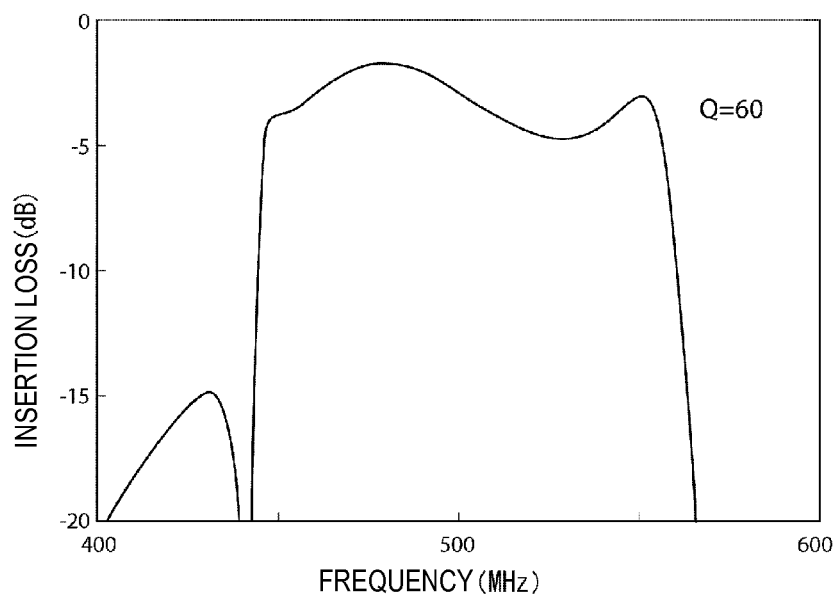
FIG. 10 is a graph illustrating insertion loss-frequency characteristics of a tunable filter in the case where the Q of inductances L1a, L1b, and L2 is 50.

Note that the insertion loss is able to be even further improved by ensuring a certain level for the Q values of the inductances, namely the inductances L1$a$, L1$b$, and L2. Based on experiments carried out by the inventors of the present invention, the insertion loss has been discovered to be more effectively improved by setting the value of Q of the inductances, namely the inductances L1$a$, L1$b$, and L2, to not less than 40. FIG. 10 illustrates the frequency characteristics of a ladder-type tunable filter in which the Q of the inductances L1$a$, L1$b$, and L2 is 50, and a total of five resonators, namely three serial arm resonators and two parallel arm resonators, for example, are connected. As is clear from FIG. 10, the insertion loss is effectively improved. Note that it is desirable that an upper limit for Q be higher in order to improve the insertion loss. However, the Q value of inductances that actually exist is 150 at the highest.

Note that the frequency characteristics illustrated in FIG. 10 are characteristics for the case where the values of the respective circuit elements are set according to the specifications indicated in Table 3 below.

TABLE 3

| Css1 = css2 | Csp1 = Csp2 | L1$a$ = L1$b$ | Cps1 | Cpp1 | L2 |
|---|---|---|---|---|---|
| 3 pF | 1.5 pF | 75 nH | 10 pF | 5 pF | 150 nH |

As described above, the circuit configuration illustrated in FIG. 1 is desirable, and the out of band attenuation is able to be ensured through such a configuration. However, when insertion loss is to be prioritized, a tunable ladder filter according to a variation illustrated in FIG. 11, a tunable ladder filter according to another variation illustrated in FIG. 12, or the like is desirable.

Figure 11:
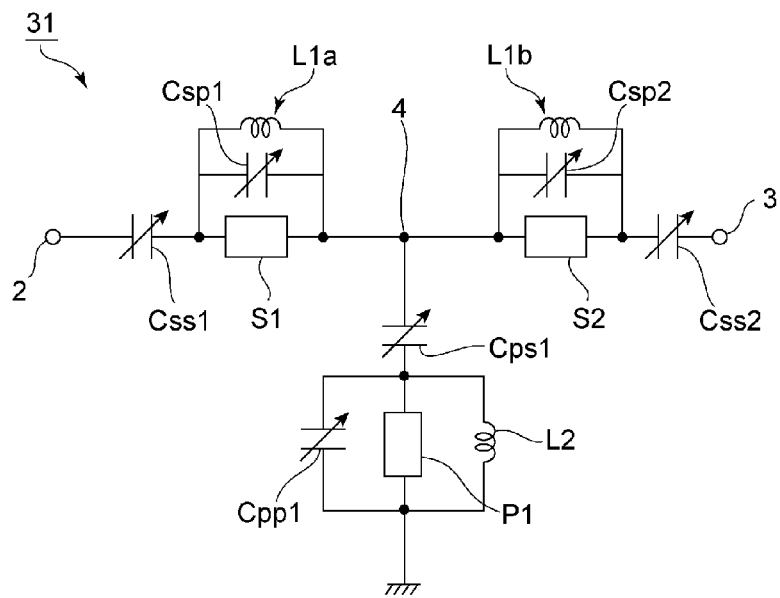
FIG. 11 is a circuit diagram illustrating a variation on a tunable filter according to a preferred embodiment of the present invention.

According to a tunable filter 31 illustrated in FIG. 11, the inductance L1$a$ is connected in parallel to the serial arm resonator S1 and the inductance L1$b$ is also connected in parallel to the serial arm resonator S2. The rest of the configuration is preferably the same as the tunable filter 1 illustrated in FIG. 1.

Figure 12:
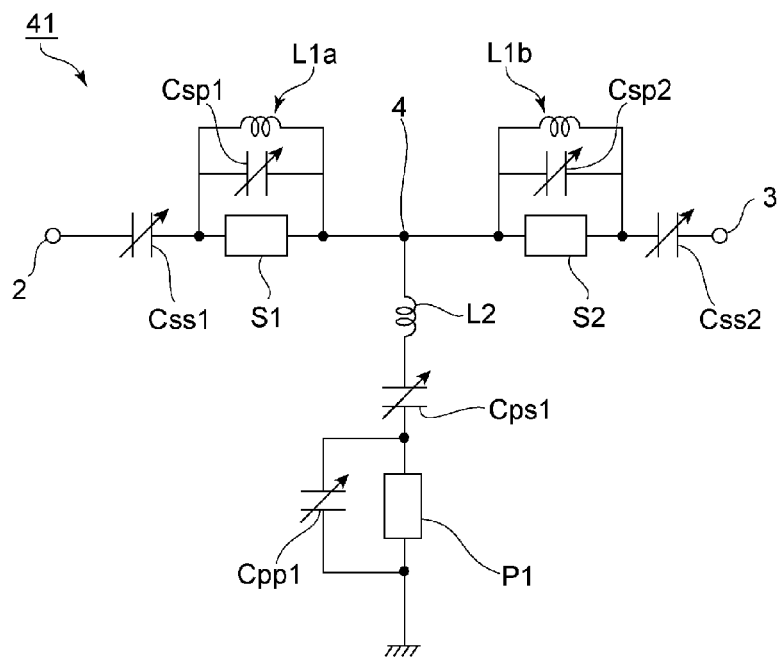
FIG. 12 is a circuit diagram illustrating another variation on a tunable filter according to a preferred embodiment of the present invention.

Meanwhile, according to a tunable filter 41 illustrated in FIG. 12, the inductance L1$a$ is connected in parallel to the serial arm resonator S1 and the inductance L1$b$ is also connected in parallel to the serial arm resonator S2. The inductance L2 is connected between the connection point 4 and the variable capacitor Cps1. The rest of the configuration of the tunable filter 41 is preferably the same as the tunable filter 1.

Figure 13:
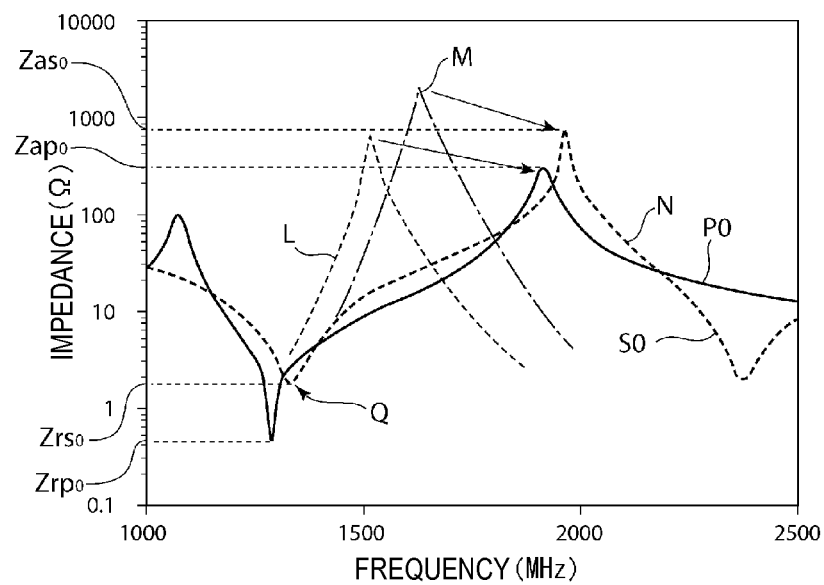
FIG. 13 is a graph illustrating impedance frequency characteristics for describing an extension effect in an inductor in the tunable filter illustrated in FIG. 11.

FIG. 13 is a graph illustrating frequency characteristics of the tunable filter 31 illustrated in FIG. 11. Due to an extension effect of the inductance L2, resonance characteristics represented by a broken line L in FIG. 13 change to the characteristics represented by the solid line, and due to an extension effect of the inductances L1a and L1b, resonance characteristics represented by a dot-dash line M change to the characteristics represented by a broken line N. As a result, the frequency characteristics represented by the solid line in FIG. 13 are obtained.

Figure 14:
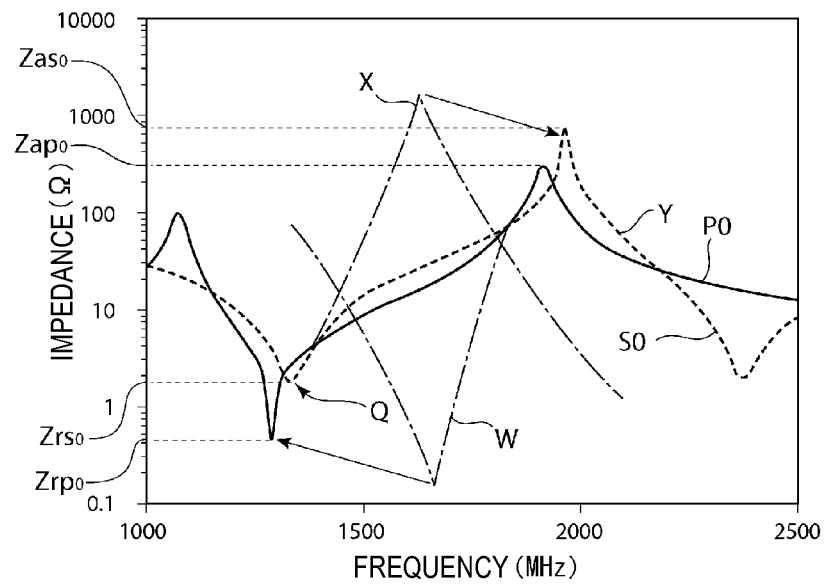
FIG. 14 is a graph illustrating impedance frequency characteristics for describing an extension effect in an inductor in the tunable filter illustrated in FIG. 12.

FIG. 14 is a graph illustrating frequency characteristics, for describing the extension effect of the inductances in the tunable filter illustrated in FIG. 12. As illustrated in FIG. 14, in the tunable filter 41, resonance characteristics represented by a dot-dash line W shift to the characteristics near a resonance point represented by the solid line due to the extension effect of the inductance L2, as indicated by the arrows. In addition, the characteristics represented by a dot-dash line X shift to the characteristics represented by a broken line Y due to the extension effect of the inductances L1a and L1b, as indicated by the arrows. According to the tunable filters 31 and 41, the insertion loss is affected by the Q values of the inductances L1a, L1b, and L2 less than in the tunable filter 1. Even in this case, it is desirable that the impedance relationship between the serial arms and the parallel arm is such that $Zrp_0$ is lower than $Zrs_0$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder circuit tunable filter comprising:
a serial arm that connects an input end to an output end;
a parallel arm that connects the serial arm to a ground potential;
a plurality of serial arm resonators connected in series to each other in the serial arm;
a parallel arm resonator provided in the parallel arm;
a first variable capacitor connected in series to at least one of the plurality of serial arm resonators;
a second variable capacitor connected in parallel to the parallel arm resonator; and
first inductors respectively connected to each of the plurality of serial arm resonators; wherein
when a resonant impedance of the plurality of serial arm resonators is represented by Zrs and a resonant impedance of the parallel arm resonator is represented by Zrp, a ratio Zrs/Zrp is not greater than 1.

2. The tunable filter according to claim 1, wherein Zrs<Zrp.

3. The tunable filter according to claim 1, wherein the first inductors are respectively connected in series to each of the plurality of serial arm resonators.

4. The tunable filter according to claim 3, wherein when a resonant impedance of a series circuit portion including the plurality of serial arm resonators and the first inductors respectively connected in series to the plurality of serial arm resonators is represented by $Zrs_0$, $Zrs_0$ is in a range from two to six times Zrp.

5. The tunable filter according to claim 3, wherein a second inductor is connected in parallel to the parallel arm resonator.

6. The tunable filter according to claim 5, wherein when a resonant impedance of a series circuit portion defined by the plurality of serial arm resonators and the first inductors respectively connected in series to the plurality of serial arm resonators is represented by $Zrs_0$ and a resonant impedance of a parallel circuit portion defined by the parallel arm resonator and the second inductor connected in parallel to the parallel arm resonator is represented by $Zrp_0$, $Zrs_0$ is in a range from two to six times $Zrp_0$.

7. The tunable filter according to claim 5, wherein when an anti-resonant impedance of a series circuit portion defined by the plurality of serial arm resonators and the first inductors respectively connected in series to the plurality of serial arm resonators is represented by $Zas_0$ and an anti-resonant impedance of a parallel circuit portion defined by the parallel arm resonator and the second inductor connected in parallel to the parallel arm resonator is represented by $Zap_0$, $Zas_0$ is greater than $Zap_0$.

8. The tunable filter according to claim 1, wherein an impedance ratio between an anti-resonant impedance and a resonant impedance of the plurality of serial arm resonators is not less than about 65 dB.

9. The tunable filter according to claim 1, wherein an impedance ratio between an anti-resonant impedance and a resonant impedance of the parallel arm resonator is not less than 65 dB.

10. The tunable filter according to claim 1, wherein Q of the first inductors is not less than about 40.

11. The tunable filter according to claim 1, wherein the first inductors are respectively connected in parallel to each of the serial arm resonators.

12. The tunable filter according to claim 11, further comprising:
a second inductor connected in parallel to the parallel arm resonator.

13. The tunable filter according to claim 12, wherein when an impedance of a parallel circuit portion including the parallel arm resonator and the second inductor is represented by $Zrp_0$ and an impedance of a series circuit portion including the plurality of serial arm resonators and the first inductors is represented by $Zrs_0$, $Zrp_0$ is lower than $Zrs_0$.

14. The tunable filter according to claim 11, further comprising:
a second inductor connected in series to the parallel arm resonator.

15. The tunable filter according to claim 14, wherein when an impedance of a parallel circuit portion including the parallel arm resonator and the second inductor is represented by $Zrp_0$ and an impedance of a series circuit portion including the plurality of serial arm resonators and the first inductors is represented by $Zrs_0$, $Zrp_0$ is lower than $Zrs_0$.

16. The tunable filter according to claim 1, wherein the plurality of serial arm resonators and the parallel arm resonator include one of surface acoustic wave resonators and boundary acoustic wave resonators.

17. The tunable filter according to claim 1, wherein the plurality of serial arm resonators and the parallel arm resonator are arranged to define one of a T-shaped ladder filter and a π-shaped ladder filter.

18. The tunable filter according to claim 1, wherein another first variable capacitor is connected in series to at least another one of the plurality of serial arm resonators.

19. The tunable filter according to claim 1, wherein a pass band width is adjustable by the first variable capacitor and the second variable capacitor.

* * * * *